(12) United States Patent
Jeon et al.

(10) Patent No.: US 9,439,301 B2
(45) Date of Patent: Sep. 6, 2016

(54) MULTILAYERED CHIP ELECTRONIC COMPONENT AND BOARD FOR MOUNTING THE SAME

(71) Applicant: SAMSUNG ELECTRO-MECHANICS CO., LTD., Suwon, Gyunggi-do (KR)

(72) Inventors: Byung Jun Jeon, Gyunggi-do (KR); Byoung Hwa Lee, Gyunggi-do (KR); Hyun Hee Gu, Gyunggi-do (KR); Chang Hoon Kim, Gyunggi-do (KR); Young Ghyu Ahn, Gyunggi-doSuwon (KR)

(73) Assignee: SAMSUNG ELECTRO-MECHANICS CO., LTD., Suwon-Si, Gyeonggi-Do (KR)

( * ) Notice: Subject to any disclaimer, the term of this patent is extended or adjusted under 35 U.S.C. 154(b) by 96 days.

(21) Appl. No.: 13/902,521

(22) Filed: May 24, 2013

(65) Prior Publication Data
US 2014/0116766 A1    May 1, 2014

(30) Foreign Application Priority Data
Oct. 26, 2012  (KR) .................. 10-2012-0119642

(51) Int. Cl.
*H02H 7/06* (2006.01)
*H05K 3/34* (2006.01)
(Continued)

(52) U.S. Cl.
CPC ............. *H05K 3/3442* (2013.01); *H01G 2/065* (2013.01); *H01G 4/232* (2013.01); *H05K 2201/10636* (2013.01); *Y02P 70/611* (2015.11); *Y02P 70/613* (2015.11)

(58) Field of Classification Search
CPC ........ H01C 1/148; H05K 1/18; H05K 1/181; H05K 1/0231; H05K 1/185; H05K 3/4602; H05K 3/3442; H05K 7/00; H05K 2201/10636; H05K 2201/10674; H01G 2/065; H01G 4/232; H01G 4/248; H01G 4/2325; H01G 4/30; H01G 4/12; H01G 4/224; H01L 21/4857; H01L 24/16; H01L 2924/01005; H01L 2924/01019; H01L 2924/01082; H01L 2924/01025; H01L 2924/01078; H01L 2924/01052; H01L 2924/15312; H01L 2224/82039; H01L 25/16; Y02P 70/613; Y02P 70/611
USPC .................. 174/260, 258; 310/311; 336/200; 338/22 R, 21; 361/321.2, 301.3, 764
See application file for complete search history.

(56) References Cited

U.S. PATENT DOCUMENTS 5,251,094 A * 10/1993 Amano et al. ............. 361/308.2
6,481,094 B1 * 11/2002 Ikeda et al. ..................... 29/612

(Continued)

FOREIGN PATENT DOCUMENTS

CN        100521001 C      7/2009
JP        2002359103 A  * 12/2002  ............... H01C 7/04

(Continued)

OTHER PUBLICATIONS

Japanese Office Action issued in Japanese Patent Application No. 2013-054660 dated Jun. 24, 2014, with English Translation.

(Continued)

*Primary Examiner* — Timothy Thompson
*Assistant Examiner* — Guillermo Egoavil
(74) *Attorney, Agent, or Firm* — McDermott Will & Emery LLP (57) ABSTRACT

There is provided a multilayered chip electronic component including: a ceramic body including internal electrodes and dielectric layers; external electrodes covering both end surfaces of the ceramic body in a length direction; first plating layers forming the external electrodes and formed on outer surfaces of the ceramic body; non-conductive layers formed on outer side surfaces of the first plating layers; and second plating layers formed on regions of the first plating layers except for the non-conductive layers.

20 Claims, 8 Drawing Sheets

(51) Int. Cl.
  *H01G 2/06* (2006.01)
  *H01G 4/232* (2006.01)

(56) References Cited

U.S. PATENT DOCUMENTS

| | | | |
|---|---|---|---|
| 6,903,919 B2* | 6/2005 | Kayatani | H01G 2/103 29/25.41 |
| 2004/0042156 A1* | 3/2004 | Devoe et al. | 361/321.2 |
| 2004/0240146 A1 | 12/2004 | Kayatani et al. | |
| 2007/0030628 A1* | 2/2007 | Yamamoto et al. | 361/311 |
| 2008/0118721 A1* | 5/2008 | Horie et al. | 428/209 |
| 2009/0217511 A1* | 9/2009 | Chen et al. | 29/620 |
| 2009/0323253 A1* | 12/2009 | Kobayashi et al. | 361/301.4 |
| 2010/0328915 A1* | 12/2010 | Inagaki | H01L 21/4857 361/764 |
| 2011/0132637 A1* | 6/2011 | Otani et al. | 174/126.1 |
| 2012/0039015 A1 | 2/2012 | Saruban et al. | |
| 2012/0080222 A1* | 4/2012 | Kim | H05K 1/0231 174/260 |
| 2012/0128865 A1* | 5/2012 | Gu et al. | 427/58 |
| 2013/0057112 A1 | 3/2013 | Shirakawa et al. | |
| 2013/0141837 A1* | 6/2013 | Lee et al. | 361/321.2 |
| 2014/0124251 A1* | 5/2014 | Park | H05K 3/3442 174/257 |

FOREIGN PATENT DOCUMENTS

| | | |
|---|---|---|
| JP | 2003-109838 A | 4/2003 |
| JP | 2005-243944 A | 9/2005 |
| JP | 2006-237078 A | 9/2006 |
| JP | 2007-281134 A | 10/2007 |
| JP | 2012-043842 A | 3/2012 |
| JP | 4953988 B2 | 6/2012 |
| JP | 2013-058558 A | 3/2013 |
| JP | 2014-036149 A | 2/2014 |

OTHER PUBLICATIONS

Japanese Office Action issued in Japanese Application No. 2013-054660 issued Jan. 7, 2014, with English translation, 6 pgs.

Notice of Office Action issued in corresponding Japanese Patent Application No. 2014-217173, mailed on Sep. 15, 2015; with English translation.

Office Action issued Feb. 2, 2016 in related Chinese Application No. 201310112139.0 (English translation provided).

* cited by examiner

MULTILAYERED CHIP ELECTRONIC COMPONENT AND BOARD FOR MOUNTING THE SAME

CROSS-REFERENCE TO RELATED APPLICATIONS

This application claims the priority of Korean Patent Application No. 10-2012-0119642 filed on Oct. 26, 2012, in the Korean Intellectual Property Office, the disclosure of which is incorporated herein by reference.

BACKGROUND OF THE INVENTION

1. Field of the Invention

The present invention relates to a multilayered chip electronic component capable of decreasing acoustic noise generated therein when a voltage is applied thereto, and a board for mounting the same.

2. Description of the Related Art

A multilayered chip capacitor, a multilayered chip electronic component, includes internal electrodes formed between a plurality of dielectric layers.

In the case in which a direct current (DC) voltage and an alternating current (AC) voltage are applied to the multilayered chip capacitor in which internal electrodes overlapped with each other, having the dielectric layer interposed therebetween, are formed, a piezoelectric phenomenon and vibrations are generated between the internal electrodes.

The vibrations may be transferred from an external electrode of the multilayered chip capacitor to a printed circuit board on which the multilayered chip capacitor is mounted. In this case, the printed circuit board is vibrated, such that noise is generated.

That is, when the noise generated due to the vibrations of the printed circuit board is included in an audio frequency range (20 to 20000 Hz), it may cause listener discomfort. This noise is known as acoustic noise.

When the voltage is applied to the multilayered chip capacitor, the multilayered chip capacitor may be deformed as follows. Upper and lower surfaces of the multilayered chip capacitor are expanded and contracted in a thickness direction, and side surfaces thereof are expanded and contracted while having an opposite phase difference from that of the upper and lower surfaces.

Due to the expansion and contraction in the side surfaces of the multilayered chip capacitor, vibrations of the multilayered chip capacitor may be transferred to the printed circuit board through a solder fillet fixing the multilayered chip capacitor to the printed circuit board.

Therefore, research into a multilayered chip electronic component capable of preventing vibrations of the multilayered chip capacitor from being transferred to the printed circuit board by forming the solder fillet at a low height has been demanded.

The following Patent Document 1 discloses a ceramic electronic component in which a conductive resin layer is deposited over an end portion of a metal plated layer in a main surface of a multilayered body in order to enhance impact resistance. In addition, the following Patent Document 2 discloses a ceramic electronic component capable of preventing overflow of welding by adjusting thicknesses of a Pd plated layer and an Au plated layer that form external electrodes.

However, these Patent Documents have not disclosed or expected a feature of preventing overflow of welding using a non-conductive layer suggested in the claims and embodiments of the present invention.

RELATED ART DOCUMENT (Patent Document 1) Japanese Patent Laid-Open Publication No. 2005-243944
(Patent Document 2) Japanese Patent Laid-Open Publication No. 2003-109838

SUMMARY OF THE INVENTION

An aspect of the present invention provides a multilayered chip electronic component capable of preventing solder from overflowing to an upper portion of the multilayered chip electronic component in a thickness direction when a printed circuit board and the multilayered chip electronic component are soldered to each other.

An aspect of the present invention also provides a board for mounting a multilayered chip electronic component capable of decreasing acoustic noise by mounting the multilayered chip electronic component on a printed circuit board.

According to an aspect of the present invention, there is provided a multilayered chip electronic component including: a ceramic body including internal electrodes and dielectric layers; external electrodes covering both end surfaces of the ceramic body in a length direction; first plating layers forming the external electrodes and formed on outer surfaces of the ceramic body; non-conductive layers formed on outer side surfaces of the first plating layers; and second plating layers formed on regions of the first plating layers except for the non-conductive layers.

At least one end portion of the non-conductive layers in a thickness direction may be extended to a portion of at least one of an upper surface and a lower surface of the ceramic body as well as the outer side surface of the first plating layer.

At least one end portion of the non-conductive layers in a thickness direction may be formed in a position higher or lower than that of at least one of an upper surface and a lower surface of the ceramic body in the thickness direction.

At least one end portion of the non-conductive layers in a thickness direction may be formed in a position higher or lower than that of at least one of a lowermost internal electrode and an uppermost internal electrode among the internal electrodes formed in the ceramic body, in the thickness direction.

The non-conductive layers may include at least one selected from a group consisting of epoxy, a heat resistant polymer, glass, and a ceramic.

The second plating layers may be only formed in band portions of the external electrodes.

The first and second plating layers may include at least one of copper (Cu), nickel (Ni), and tin (Sn).

According to another aspect of the present invention, there is provided a board for mounting a multilayered chip electronic component, the board including: the multilayered chip electronic component of claim 1; electrode pads connected to the second plating layers by soldering fillets; and a printed circuit board having the electrode pads formed thereon, wherein the soldering fillets are formed to respective one ends of the non-conductive layers adjacent to the printed circuit board.

At least one end portion of the non-conductive layers in a thickness direction may be extended to a portion of at least one of an upper surface and a lower surface of the ceramic body as well as the outer side surface of the first plating layer.

The non-conductive layer may include at least one selected from a group consisting of epoxy, a heat resistant polymer, glass, and a ceramic.

The second plating layers may be only formed in band portions of the external electrodes.

The first and second plating layers may include at least one of copper (Cu), nickel (Ni), and tin (Sn).

According to another aspect of the present invention, there is provided a multilayered chip electronic component including: first plating layers formed on side surfaces and an upper surface of a ceramic body having a hexahedral shape; non-conductive layers formed on the side surfaces of the ceramic body; and second plating layers coated on regions of the first plating layers except for the non-conductive layers.

At least one end portion of the non-conductive layers in a thickness direction may be extended to a portion of at least one of the upper surface and a lower surface of the ceramic body as well as an outer side surface of the first plating layer.

At least one end portion of the non-conductive layers in a thickness direction may be formed in a position higher or lower than that of at least one of the upper surface and a lower surface of the ceramic body, in the thickness direction.

At least one end portion of the non-conductive layers in a thickness direction may be formed in a position higher or lower than that of at least one of a lowermost internal electrode and an uppermost internal electrode among the internal electrodes formed in the ceramic body, in the thickness direction.

The non-conductive layers may include at least one selected from a group consisting of epoxy, a heat resistant polymer, glass, and a ceramic.

The second plating layer may only be formed in band portions of external electrodes.

The first and second plating layers may include at least one of nickel (Ni) and tin (Sn).

According to another aspect of the present invention, there is provided a board for mounting a multilayered chip electronic component, the board including: the multilayered chip electronic component of claim 13; electrode pads connected to the second plating layers by soldering fillets; and a printed circuit board having the electrode pads formed thereon, wherein the soldering fillets are formed to respective one ends of the non-conductive layers adjacent to the printed circuit board.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE EMBODIMENTS

Hereinafter, embodiments of the present invention will be described in detail with reference to the accompanying drawings. The invention may, however, be embodied in many different forms and should not be construed as being limited to the embodiments set forth herein. Rather, these embodiments are provided so that this disclosure will be thorough and complete, and will fully convey the scope of the invention to those skilled in the art. In the drawings, the shapes and dimensions of elements may be exaggerated for clarity, and the same reference numerals will be used throughout to designate the same or like elements.

A multilayered chip electronic component according to an embodiment of the present invention may be appropriately used in a multilayered ceramic capacitor, a multilayered varistor, a thermistor, a piezoelectric element, a multilayer substrate, or the like, having a structure in which a dielectric layer is used and internal electrodes face each other, having the dielectric layer interposed therebetween.

Multilayered Chip Capacitor

Figure 1:
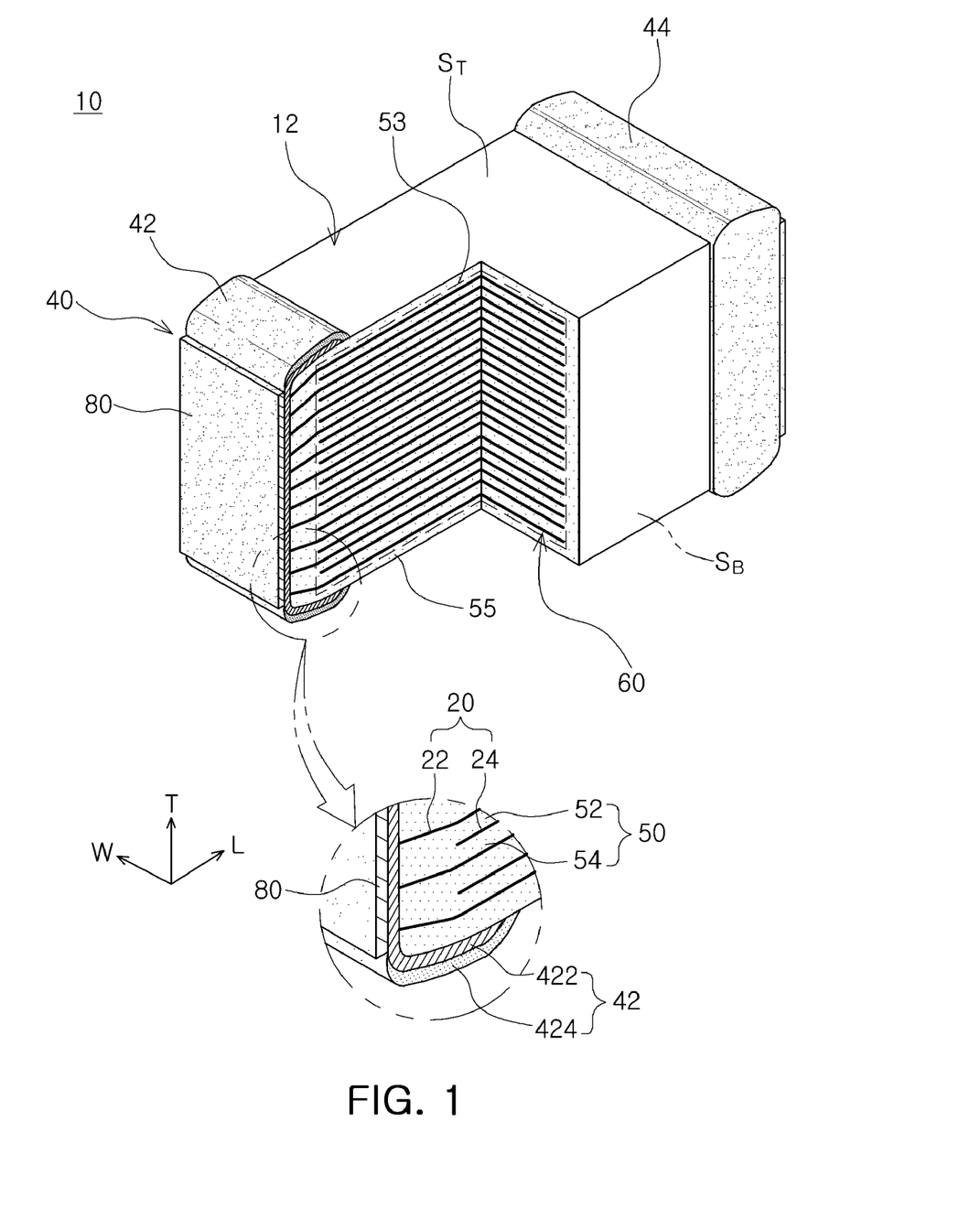
FIG. 1 is a schematic partially cut-away perspective view of a multilayered chip capacitor according to an embodiment of the present invention.
Figure 2:
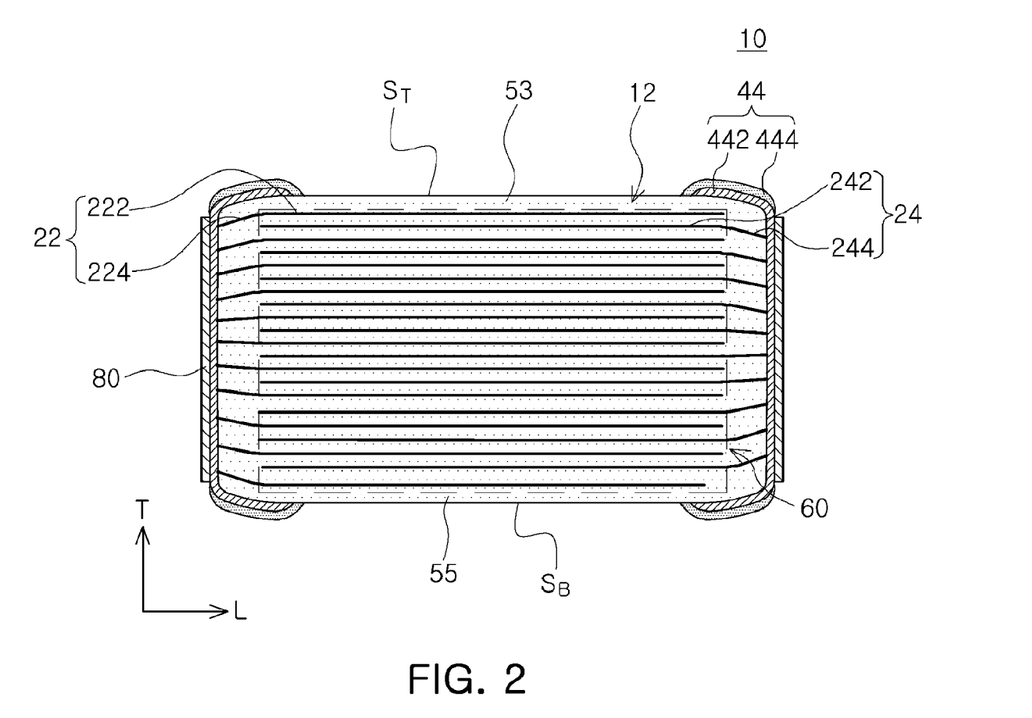
FIG. 2 is a cross-sectional view of the multilayered chip capacitor of FIG. 1, taken in a length direction and a thickness direction.

FIG. 1 is a schematic partially cut-away perspective view of a multilayered chip capacitor according to an embodiment of the present invention; and FIG. 2 is a cross-sectional view of the multilayered chip capacitor of FIG. 1, taken in a length direction and a thickness direction.

Figure 3:
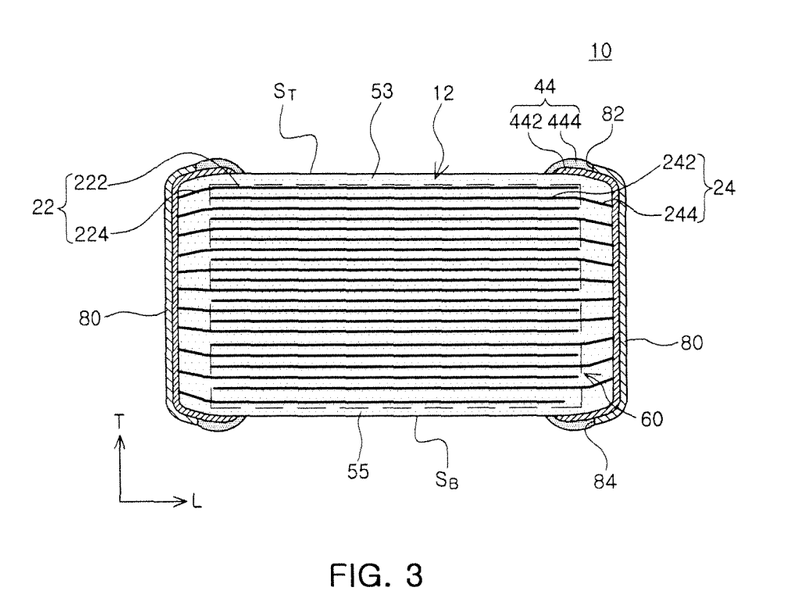
FIG. 3 is a cross-sectional view of a first example of the multilayered chip capacitor, taken in the length direction and the thickness direction.
Figure 4:
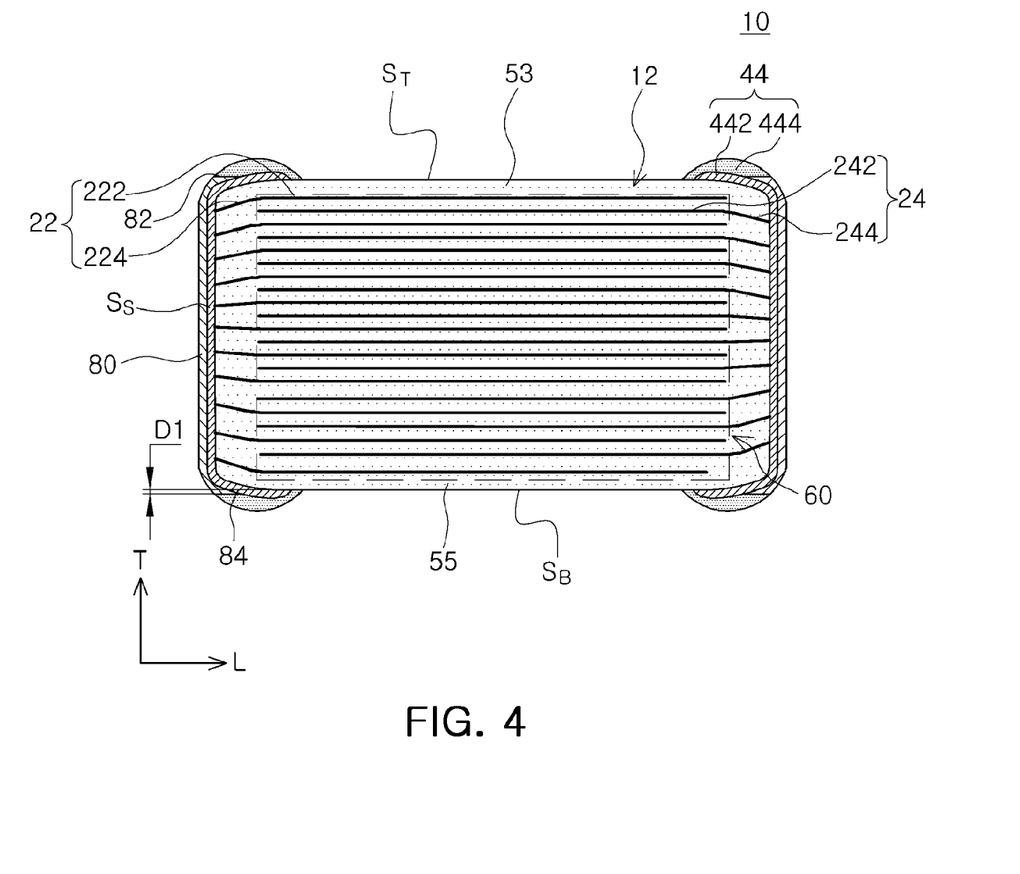
FIG. 4 is a cross-sectional view of a second example of the multilayered chip capacitor, taken in the length direction and the thickness direction.
Figure 5:
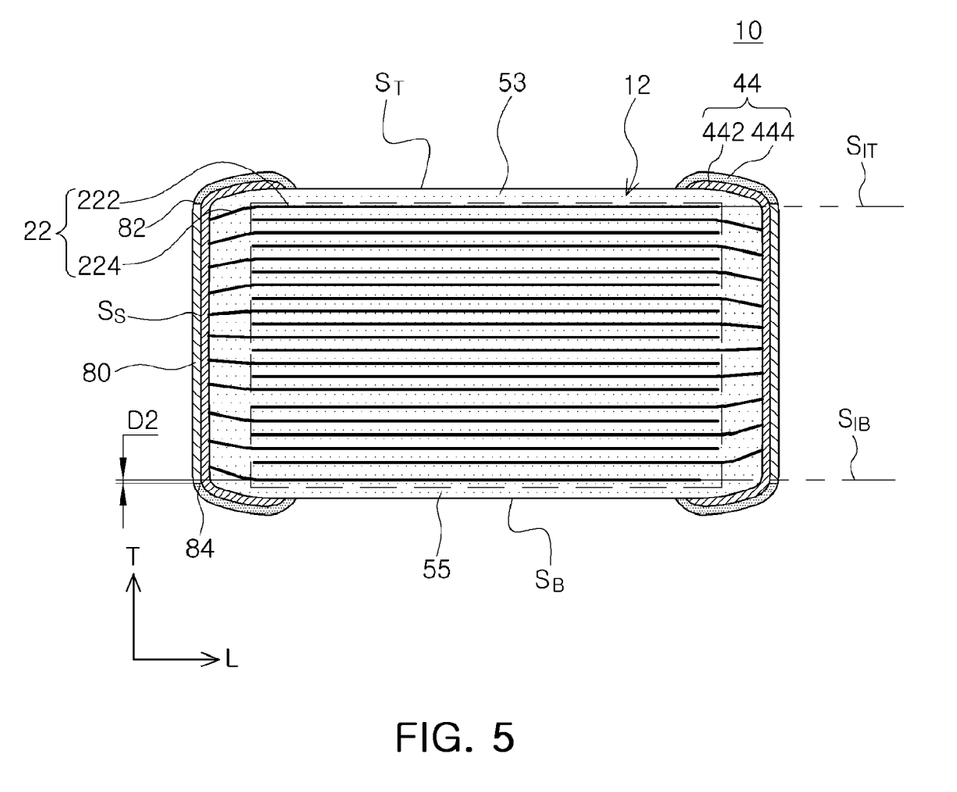
FIG. 5 is a cross-sectional view of a third example of the multilayered chip capacitor, taken in the length direction and the thickness direction.

In addition, FIG. 3 is a cross-sectional view of a first example of the multilayered chip capacitor, taken in the length direction and the thickness direction; FIG. 4 is a cross-sectional view of a second example of the multilayered chip capacitor, taken in the length direction and the thickness direction; and FIG. 5 is a cross-sectional view of a third example of the multilayered chip capacitor, taken in the length direction and the thickness direction.

Referring to FIGS. 1 through 5, a multilayered chip capacitor 10 may include a ceramic body 12, external electrodes 40, internal electrodes 20, and non-conductive layers 80.

The ceramic body 12 may be manufactured by applying a conductive paste to ceramic green sheets so as to form the internal electrodes 20 on the ceramic green sheets and stacking, compressing, and then firing the ceramic green sheets on which the internal electrodes 20 are formed. The ceramic body 12 may be formed by repeatedly stacking a plurality of the dielectric layers 52 and 54 and internal electrodes 22 and 24.

The ceramic body 12 may have a hexahedral shape. Although the ceramic body 12 may not have a hexahedral shape having perfectly straight lines due to firing shrinkage of a ceramic powder at the time of firing a chip, it may have a substantially hexahedral shape.

Directions of the hexahedron will be defined in order to clearly describe the embodiments of the present invention. L, W and T shown in FIG. 1 refer to a length direction, a width direction, and a thickness direction, respectively. Here, the thickness direction may be used to have the same meaning as a direction in which the dielectric layers are stacked.

The multilayered chip capacitor 10 having a rectangular parallelepiped form in which it has a length larger than a width or a thickness is shown in FIG. 1. As a material forming dielectric layers 50, a ceramic powder having high permittivity may be used in order to realize a high capacity capacitor. The ceramic powder may be, for example, a barium titanate ($BaTiO_3$) based power or a strontium titanate ($SrTiO_3$) based power, or the like, but is not limited thereto.

The internal electrodes 20 may include the first and second internal electrodes 22 and 24 electrically connected to first and second external electrodes 42 and 44, respectively.

Here, the first and second internal electrodes 22 and 24 may include first and second electrode pattern portions 222 and 242 overlapped with each other while facing each other, having the dielectric layer 54 (See FIG. 1) therebetween, and first and second lead portions 224 and 244 lead to the first and second external electrodes 42 and 44, respectively.

The first and second electrode pattern portions 222 and 242 may be continuously stacked in the thickness direction to configure an active layer 60 forming capacitance in the ceramic body 12.

In a cross section of the multilayered chip capacitor in length and thickness directions, portions except for the active layer 60 may be defined as margin portions. In the margin portions, an upper margin portion and a lower margin portion of the active layer 60 in the thickness direction may be particularly defined as an upper cover layer 53 and a lower cover layer 55.

The upper cover layer 53 and the lower cover layer 55 may be formed by sintering a plurality of ceramic green sheets to which the conductive paste for forming the internal electrodes is not applied, unlike the dielectric layers 52 and 54 formed between the first and second internal electrodes 22 and 24.

The plurality of dielectric layers 50 including the upper cover layer 53 and the lower cover layer 55 may be in a sintered state. Adjacent dielectric layers may be integrated with each other such that a boundary therebetween may not be discernible without using a scanning electron microscope (SEM).

The external electrodes 40 may cover both end surfaces of the ceramic body 12 in the length direction. Here, one external electrode formed on one end surface of the ceramic body 12 in the length direction may be defined as the first external electrode 42, and the other external electrode formed on the other end surface of the ceramic body 12 in the length direction may be defined as the second external electrode 44.

Since portions of the external electrodes 40 formed on outer side surfaces, an upper surface $S_T$, and a lower surface $S_B$ of the ceramic body 12 except for the end surfaces of the ceramic body 12 in the length direction respectively have a shape of a band having a predetermined width, the portions of the external electrodes 40 may be defined as band portions.

Although the multilayered chip capacitor having the external electrodes formed on both end surfaces thereof in the length direction is described in the present embodiment, the present invention is not limited thereto, but may also be applied to an array type multilayered chip capacitor in which a plurality of external electrodes are formed on side surfaces of the ceramic body 12.

The first and second external electrodes 42 and 44 may be formed of a conductive paste containing a metal powder. The first and second external electrodes 42 and 44 may have first plating layers 422 and 442 directly coated on outer surfaces of the ceramic body 12. Here, the first plating layers 422 and 442 may include at least one of copper (Cu), nickel (Ni), and tin (Sn), but is not particularly limited thereto.

The non-conductive layers 80 may be formed on outer side surfaces of the first plating layer 422 and 442. In addition, second plating layers 424 and 444 may be coated on regions of the first plating layers 422 and 442 except for the non-conductive layers 80 in an electroplating method.

The non-conductive layers 80 may prevent the second plating layers 424 and 444 from being coated. In addition, when the multilayered chip capacitor 10 is surface-mounted on a printed circuit board 120 (See FIG. 6), the non-conductive layers 80 may prevent a solder paste formed on an electrode pad 122 (See FIG. 6) to be wetted, such that they may not be smear with a solder.

Therefore, when the multilayered chip capacitor 10 is surface-mounted on the printed circuit board 120 (See FIG. 6), the non-conductive layers 80 may allow a decrease in a height of solder fillets 142 and 144 (See FIG. 6) fixing the multilayered chip capacitor 10 to the printed circuit board 120.

Here, the second plating layers 424 and 444 may include at least one of Cu, Ni, and Sn, but is not particularly limited thereto.

FIGS. 3 through 5 show respective examples of the multilayered chip capacitor according to forms of the non-conductive layers 80.

In the multilayered chip capacitor 10 of FIG. 3, at least one end portion 82 or 84 of the non-conductive layers 80 in the thickness direction may be extended to at least a portion of the upper surface $S_T$ and the lower surface $S_B$ of the ceramic body 12 as well as outer side surfaces $S_S$ of the first plating layers 422 and 442.

As shown in FIG. 3, the non-conductive layers 80 extended to a portion of the respective band portions of the external electrodes 40, may allow a significant decrease in the height of the solder fillets when the multilayered chip capacitor 10 is formed on the printed circuit board.

In the multilayered chip capacitor 10 of FIG. 4, at least one end portion 82 or 84 of the non-conductive layers 80 in the thickness direction may be formed in a position higher or lower than that of at least one of the upper surface $S_T$ and the lower surface $S_B$ of the ceramic body 12 in the thickness direction (at a position lower by D1).

In the case of the examples of FIGS. 3 and 4, the second plating layers 424 and 444 may only be formed in the band portions of the external electrodes 40.

In the multilayered chip capacitor 10 of FIG. 5, at least one end portion 82 or 84 of the non-conductive layers 80 in the thickness direction may be formed in a position higher or lower than that of at least one of a lowermost internal electrode $S_{IT}$ and an uppermost internal electrode $S_{IB}$ among the internal electrodes formed in the ceramic body 12 in the thickness direction (at a position lower by D2).

In the case in which the non-conductive layers 80 are formed as shown in FIGS. 4 and 5, the height of the solder fillets 142 and 144 is higher as compared with the case of FIG. 3, but reliability in mounting may be improved.

Meanwhile, the non-conductive layers 80 may include at least one selected from a group consisting of epoxy, a heat resistant polymer, glass, and a ceramic.

Board for Mounting Multilayered Chip Capacitor

Figure 6:
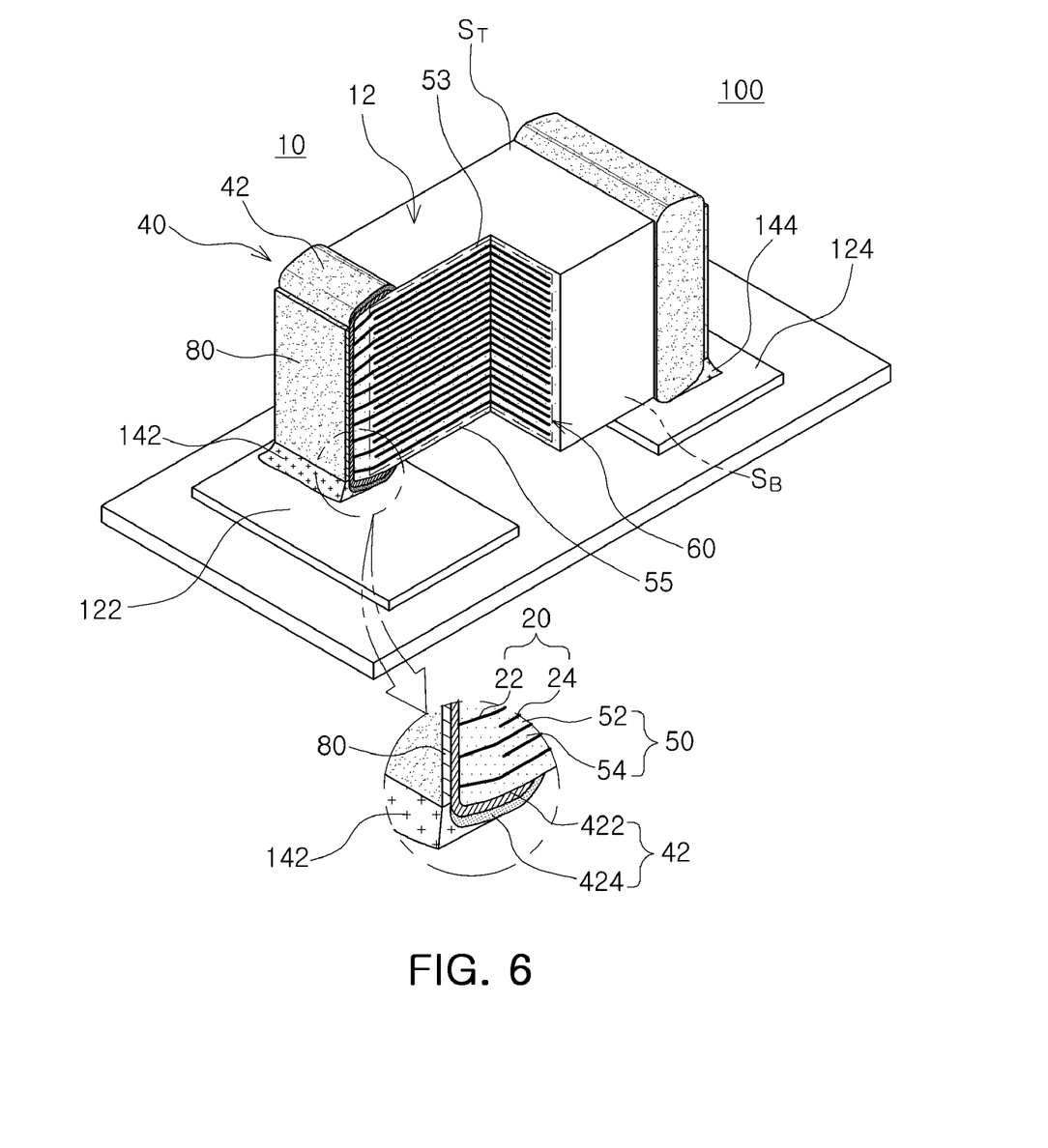
FIG. 6 is a schematic perspective view showing a form in which the multilayered chip capacitor according to the embodiment of the present invention is mounted on a printed circuit board.
Figure 7:
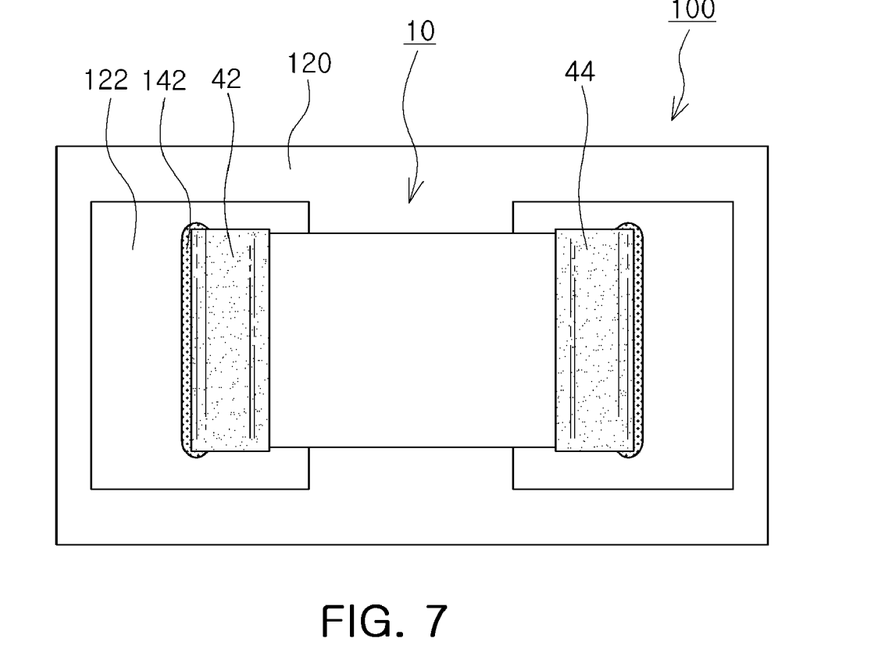
FIG. 7 is a schematic plan view showing the form in which the multilayered chip capacitor of FIG. 6 is mounted on the printed circuit board.

FIG. 6 is a schematic perspective view showing a form in which the multilayered chip capacitor according to the embodiment of the present invention is mounted on a printed circuit board; and FIG. 7 is a schematic plan view showing the form in which the multilayered chip capacitor of FIG. 6 is mounted on the printed circuit board.

Referring to FIGS. 6 and 7, a board 100 for mounting a multilayered chip capacitor according to the present embodiment may include the multilayered chip electronic component 10, electrode pads 122 and 124, and the printed circuit board 120.

The multilayered chip electronic component 10 may be the above-mentioned multilayered chip capacitor. The multilayered chip capacitor 10 may be mounted on the printed circuit board 120 such that the internal electrodes 22 and 24 are in parallel with the printed circuit board 120.

In addition, the printed circuit board 120 and the second plating layers 424 and 444 of the multilayered chip electronic component 10 may be connected to the electrode pads 122 and 124 by the soldering fillets 142 and 144, and the soldering fillets 142 and 144 may be formed to respective one ends of the non-conductive layers 80 adjacent to the printed circuit board 120.

When a voltage is applied to the multilayered chip capacitor 10 in a state in which the multilayered chip capacitor 10 is mounted on the printed circuit board 120, acoustic noise may be generated. The acoustic noise may be reduced by decreasing the height of the soldering fillets 122 and 124.

Figure 8:
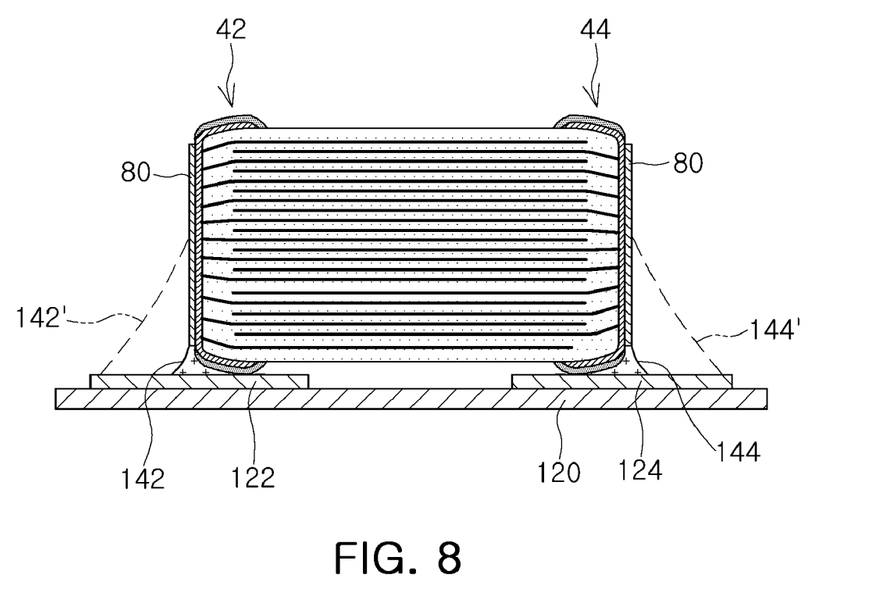
FIG. 8 is a cross-sectional view showing the form in which the multilayered chip capacitor of FIG. 6 is mounted on the printed circuit board, taken in the length direction and the thickness direction.
Figure 9:
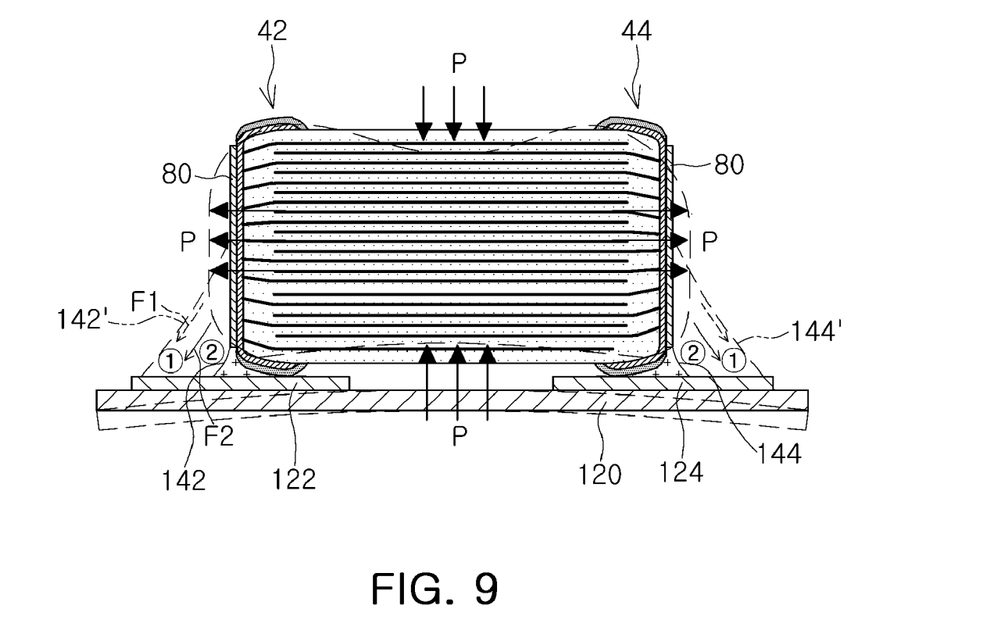
FIG. 9 is a cross-sectional view schematically showing a deformed state of the multilayered chip capacitor when a voltage is applied thereto in a state in which the multilayered chip capacitor is mounted on the printed circuit board.

FIG. 8 is a cross-sectional view showing the form in which the multilayered chip capacitor of FIG. 6 is mounted on the printed circuit board, taken in the length direction and the thickness direction; and FIG. 9 is a cross-sectional view schematically showing a deformed state of the multilayered chip capacitor when a voltage is applied thereto in a state in which the multilayered chip capacitor is mounted on the printed circuit board.

When voltages having different polarities are applied to the first and second external electrodes 42 and 44 formed on both end surfaces of the multilayered chip capacitor 10, the ceramic body 12 may be expanded and contracted in the thickness direction due to an inverse piezoelectric effect of the dielectric layers, and both end portions of the first and second external electrodes 42 and 44 in the length direction may be contracted and expanded in a direction perpendicular to the expansion and contraction of the ceramic body 12 in the thickness direction, due to a Poisson effect (in a direction P in FIG. 9).

Here, FIG. 9 shows a deformed amount of printed circuit board 120 according to a size of the soldering fillets 142 and 144 in the case in which voltages having different polarities are applied to the first and second external electrodes 42 and 44.

A virtual dot line shown in FIG. 9 indicates the case in which soldering fillets 142' and 144' are formed to a height corresponding to the approximate center of the ceramic body 12. That is, in the case in which the soldering fillets 142' and 144' are formed to the height corresponding to the approximate center of the ceramic body 12, a deformed amount of ceramic body 12 may be transferred to the soldering fillets 142' and 144'. In this case, force F1 (in a direction ①) acting on the soldering fillets 142' and 144' may be larger than force F2 (in a direction ②) acting on the soldering fillets 142 and 144 according to the embodiment of the present invention. That is, in the case in which the height of the soldering fillets 142' and 144' is high, deformation of the printed circuit board 120 may be large and a magnitude of the acoustic noise may be high.

Therefore, in the case in which the height of the soldering fillets 142 and 144 is defined by the non-conductive layers 80 according to the embodiment of the present invention, the printed circuit board 120 may hardly be deformed, and the acoustic noise may be significantly decreased.

As set forth above, in the multilayered chip capacitor and the board for mounting the same according to the embodiments of the present invention, the acoustic noise may be significantly decreased.

While the present invention has been shown and described in connection with the embodiments, it will be apparent to those skilled in the art that modifications and variations can be made without departing from the spirit and scope of the invention as defined by the appended claims.

What is claimed is:

1. A multilayered chip electronic component comprising:
    a ceramic body including internal electrodes and dielectric layers;
    external electrodes covering both end surfaces of the ceramic body in a length direction;
    first plating layers forming the external electrodes and formed on outer surfaces of the ceramic body;
    non-conductive layers formed on outer side surfaces of the first plating layers; and
    second plating layers formed on regions of outer surfaces of the first plating layers except for the non-conductive layers,
    wherein the non-conductive layers are formed on the outer side surfaces of the first plating layers except on outer surfaces of the second plating layers.

2. The multilayered chip electronic component of claim 1, wherein at least one end portion of the non-conductive layers in a thickness direction is extended to a portion of at least one of an upper surface and a lower surface of the ceramic body as well as the outer side surface of the first plating layer.

3. The multilayered chip electronic component of claim 1, wherein at least one end portion of the non-conductive layers in a thickness direction is formed in a position higher or lower than that of at least one of an upper surface and a lower surface of the ceramic body in the thickness direction.

4. The multilayered chip electronic component of claim 1, wherein at least one end portion of the non-conductive layers in a thickness direction is formed in a position higher or lower than that of at least one of a lowermost internal electrode and an uppermost internal electrode among the internal electrodes formed in the ceramic body, in the thickness direction.

5. The multilayered chip electronic component of claim 1, wherein the non-conductive layers include at least one selected from a group consisting of epoxy, a heat resistant polymer, glass, and a ceramic.

6. The multilayered chip electronic component of claim 1, wherein the second plating layers are only formed in band portions of the external electrodes formed on the outer side surfaces, an upper surface, and a lower surface of the ceramic body except for the end surfaces of the ceramic body.

7. The multilayered chip electronic component of claim 1, wherein the first and second plating layers include at least one of copper (Cu), nickel (Ni), and tin (Sn).

8. A board for mounting a multilayered chip electronic component, the board comprising:
 a multilayered chip electronic component comprising:
  a ceramic body including internal electrodes and dielectric layers;
  external electrodes covering both end surfaces of the ceramic body in a length direction;
  first plating layers forming the external electrodes and formed on outer surfaces of the ceramic body;
  non-conductive layers formed on outer side surfaces of the first plating layers; and
  second plating layers formed on regions of outer surfaces of the first plating layers except for the non-conductive layers;
 electrode pads connected to the second plating layers by soldering fillets; and
 a printed circuit board having the electrode pads formed thereon,
 wherein the soldering fillets are formed to respective one ends of the non-conductive layers adjacent to the printed circuit board.

9. The board of claim 8, wherein at least one end portion of the non-conductive layers in a thickness direction is extended to a portion of at least one of an upper surface and a lower surface of the ceramic body as well as the outer side surface of the first plating layer.

10. The board of claim 8, wherein the non-conductive layers includes at least one selected from a group consisting of epoxy, a heat resistant polymer, glass, and a ceramic.

11. The board of claim 8, wherein the second plating layers are only formed in band portions of the external electrodes.

12. The board of claim 8, wherein the first and second plating layers include at least one of copper (Cu), nickel (Ni), and tin (Sn).

13. A multilayered chip electronic component comprising:
 first plating layers formed on side surfaces and an upper surface of a ceramic body having a hexahedral shape;
 non-conductive layers formed on the side surfaces of the ceramic body; and
 second plating layers coated on regions of outer surfaces of the first plating layers except for the non-conductive layers,
 wherein the second plating layers are only formed in band portions of external electrodes formed on the outer side surfaces, an upper surface, and a lower surface of the ceramic body except for the end surfaces of the ceramic body.

14. The multilayered chip electronic component of claim 13, wherein at least one end portion of the non-conductive layers in a thickness direction is extended to a portion of at least one of the upper surface and a lower surface of the ceramic body as well as an outer side surface of the first plating layer.

15. The multilayered chip electronic component of claim 13, wherein at least one end portion of the non-conductive layers in a thickness direction is formed in a position higher or lower than that of at least one of the upper surface and a lower surface of the ceramic body, in the thickness direction.

16. The multilayered chip electronic component of claim 13, wherein at least one end portion of the non-conductive layers in a thickness direction is formed in a position higher or lower than that of at least one of a lowermost internal electrode and an uppermost internal electrode among the internal electrodes formed in the ceramic body, in the thickness direction.

17. The multilayered chip electronic component of claim 13, wherein the non-conductive layers include at least one selected from a group consisting of epoxy, a heat resistant polymer, glass, and a ceramic.

18. The multilayered chip electronic component of claim 13, wherein the first and second plating layers include at least one of nickel (Ni) and tin (Sn).

19. A board for mounting a multilayered chip electronic component, the board comprising:
 the multilayered chip electronic component of claim 13;
 electrode pads connected to the second plating layers by soldering fillets; and
 a printed circuit board having the electrode pads formed thereon,
 wherein the soldering fillets are formed to respective one ends of the non-conductive layers adjacent to the printed circuit board.

20. The multilayered chip electronic component of claim 1, wherein the non-conductive layers are formed directly on the outer side surfaces of the first plating layers.

* * * * *